(12) United States Patent
Soyano (10) Patent No.: US 8,698,287 B2
(45) Date of Patent: Apr. 15, 2014

(54) SEMICONDUCTOR DEVICE

(75) Inventor: Shin Soyano, Shiojiri (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 166 days.

(21) Appl. No.: 13/319,659

(22) PCT Filed: Jun. 9, 2010

(86) PCT No.: PCT/JP2010/003834
§ 371 (c)(1),
(2), (4) Date: Dec. 8, 2011

(87) PCT Pub. No.: WO2010/150471
PCT Pub. Date: Dec. 29, 2010

(65) Prior Publication Data
US 2012/0074542 A1    Mar. 29, 2012

(30) Foreign Application Priority Data
Jun. 25, 2009    (JP) .................................. 2009-151381

(51) Int. Cl.
*H01L 23/552*    (2006.01)

(52) U.S. Cl.
USPC ............ 257/660; 257/704; 257/710; 438/125

(58) Field of Classification Search
USPC ....................................................... 257/660
See application file for complete search history.

(56) References Cited

U.S. PATENT DOCUMENTS

| 2002/0024120 A1* | 2/2002 | Yoshimatsu et al. .......... 257/659 |
| 2003/0042624 A1 | 3/2003 | Shinohara |
| 2006/0060982 A1 | 3/2006 | Ikawa et al. |
| 2006/0067059 A1 | 3/2006 | Ushijima et al. |
| 2008/0318447 A1* | 12/2008 | Tomioka et al. ............. 439/76.1 |

FOREIGN PATENT DOCUMENTS

| JP | 2002-076257 A | 3/2002 |
| JP | 2003-068940 A | 3/2003 |
| JP | 2004-022705 A | 1/2004 |
| JP | 2005-108899 A | 4/2005 |
| JP | 2005-142228 A | 6/2005 |
| JP | 2005-235833 A | 9/2005 |
| JP | 3750427 | 12/2005 |
| JP | 2006-093255 A | 4/2006 |
| JP | 2006-100327 A | 4/2006 |
| JP | 2007-110000 A | 4/2007 |
| JP | 2009-158642 A | 7/2009 |

* cited by examiner

*Primary Examiner* — Ajay K Arora
(74) *Attorney, Agent, or Firm* — Rabin & Berdo, P.C.

(57) ABSTRACT

A semiconductor device, in which a control circuit board is mountable outside a sheath case and a power semiconductor element is placeable inside the sheath case, includes a metal step support, a shield plate and a metal ring. The support includes a base portion implanted in the sheath case, a connection portion which extends from an end of the base portion, and a step portion formed at a boundary between the base portion and the connection portion. The shield plate is disposed over the step portion such that the connection portion of the support pierces the shield plate. An end of the metal ring protrudes from an end of the connection portion over the shield plate. The semiconductor device is adapted such that the control circuit board is mounted over the protruded end of the metal ring and is fixed onto the connection portion by an engagement member.

16 Claims, 6 Drawing Sheets

SEMICONDUCTOR DEVICE

This application is the national phase of international application number PCT/JP2010/003834, filed Jun. 9, 2010, and claims the benefit of priority of Japanese application 2009-151381, filed Jun. 25, 2009. The disclosures of the international application and the Japanese priority applications are incorporated herein by reference.

BACKGROUND OF THE INVENTION

1. Field of the Invention

This invention relates to a semiconductor device and, more particularly, to a semiconductor device in which a control circuit board is mounted outside a sheath case inside which a power semiconductor element is placed.

2. Description of the Related Art

For example, a semiconductor device for controlling a motor which has a built-in semiconductor module with a power semiconductor element, such as an IGBT (Insulated Gate Bipolar Transistor), is known. Such a semiconductor module is placed within a sheath case of resin. A main circuit terminal (screw terminal) of the semiconductor module is formed on the surface of the sheath case and an auxiliary terminal (pin terminal) of the semiconductor module is drawn out to the outside via the sheath case or its lid.

In some cases, a control circuit board for controlling a semiconductor module or the like is mounted outside a sheath case (see, for example, Japanese Patent No. 3,750,427 (Patent Document 1)). With a semiconductor device disclosed in Patent Document 1, a screw seat is implanted in a sheath case, a control circuit board is mounted over the screw seat, and the control circuit board is fixed by means of a screw.

By the way, a semiconductor module and a control circuit board produce noise at the time of switching operation. The noise produced by the semiconductor module may have an influence on the control circuit board and vice versa. Accordingly, the control circuit board is mounted over a screw seat apart from a sheath case so that the noise will not have an influence thereon. If this has no effect, a measure against the noise is taken for the control circuit board, or a shield plate is placed between the semiconductor module and the control circuit board.

If a measure against the noise is taken for the control circuit board, a metal foil is stuck on the entire surface on the sheath case side of the control circuit board and is electrically connected to ground. By doing so, the noise produced by one of the semiconductor module and the control circuit board is cut off partially by the metal foil and the influence on the other can be curbed.

If a shield plate is used for cutting off the noise, the shield plate is mounted over a screw seat implanted in the sheath case, a metal ring is placed over a portion of the shield plate corresponding to the screw seat, the control circuit board is mounted over the metal ring, and the shield plate and the control circuit board placed thereover are screwed to the screw seat. By placing the shield plate between the semiconductor module and the control circuit board, the noise produced by one of the semiconductor module and the control circuit board is cut off partially by the shield plate and the influence on the other can be curbed. A metal plate of a material corresponding to the properties of the noise is used as the shield plate. By doing so, the noise can be cut off effectively.

However, the above method of placing the shield plate, the metal ring, and the control circuit board over the screw seat and screwing them to the screw seat causes a problem with assembly. That is to say, when the metal ring is placed at a determined position over the shield plate, assembly is performed in an unstable state without a guide. Therefore, the metal ring shifts due to, for example, vibration. In addition, when the control circuit board is mounted over the metal ring, the position of the metal ring cannot be looked at. As a result, it is difficult to set the metal ring at a regular position.

The present invention was made under the background circumstances described above. An object of the present invention is to provide a semiconductor device in which the assembly of a shield plate, a metal ring, and a control circuit board is improved.

SUMMARY OF THE INVENTION

In order to solve the above problem, a step support is used as a member over which a shield plate and a control circuit board are mounted in a semiconductor device according to the present invention. In the semiconductor device, the control circuit board is mounted outside a sheath case inside which a power semiconductor element is placed. This step support includes a base portion implanted in the sheath case, a connection portion which extends from an end of the base portion, and a step portion formed at a boundary between the base portion and the connection portion. The shield plate is mounted over the step portion of the step support in a state in which the connection portion of the step support pierces the shield plate. A pipe-like metal ring is placed around the connection portion of the step support so that the pipe-like metal ring will be pierced by the connection portion of the step support. At this time an end of the metal ring protrudes from an end of the connection portion. As a result, a laminated structure of metal is formed from the step portion of the step support to the metal ring over which the control circuit board is mounted.

By adopting the above semiconductor device, the connection portion of the step support positions the metal ring. Accordingly, the assembly of the shield plate, the metal ring, and the control circuit board can be performed easily and the shield plate can be connected electrically to the control circuit board.

With the semiconductor device having the above structure, the shield plate is mounted over the step support and the metal ring is mounted over the shield plate so that the metal ring will be pierced by the connection portion of the step support. By doing so, the metal ring can be positioned easily and the assembly can be rationalized. In addition, with the above semiconductor device the control circuit board touches not the connection portion of the step support to which it is screwed but the metal ring which protrudes from the connection portion of the step support. Accordingly, there is no metal play, and looseness of a screw caused by, for example, vibration can be minimized.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described in detail with reference to the drawings with a semiconductor device including a semiconductor module with a plurality of power semiconductor elements and a control circuit board as an example.

Figure 1:
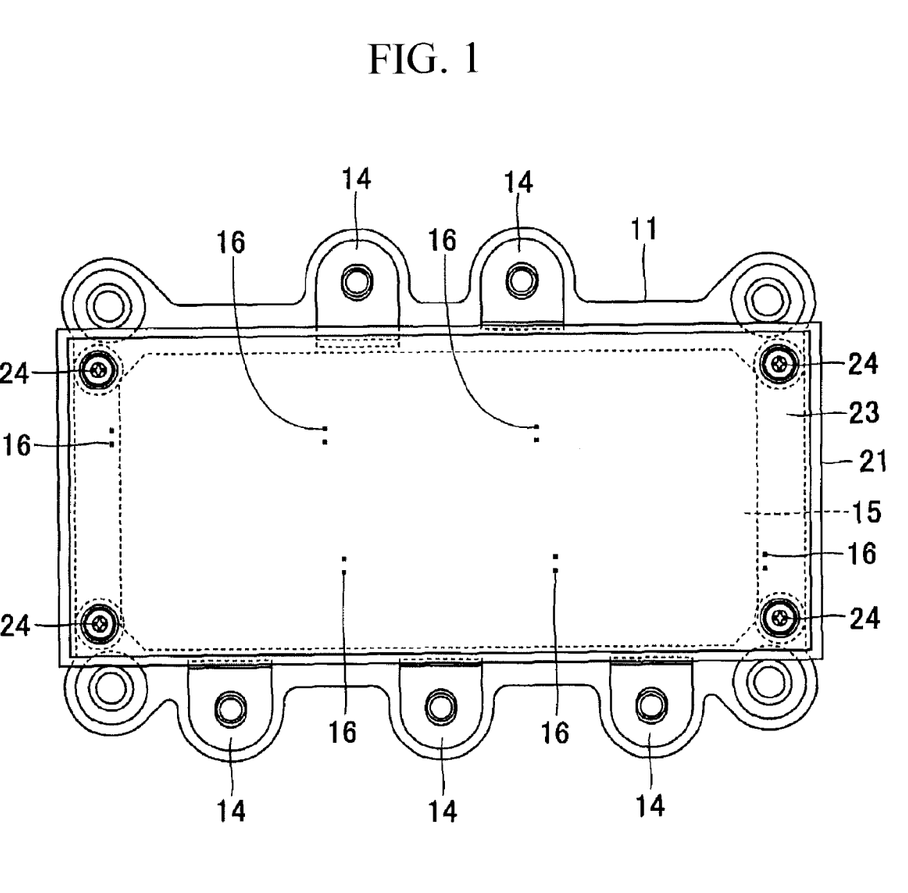
FIG. 1 shows a plan view which illustrates the appearance of a semiconductor device according to an embodiment.
Figure 2:
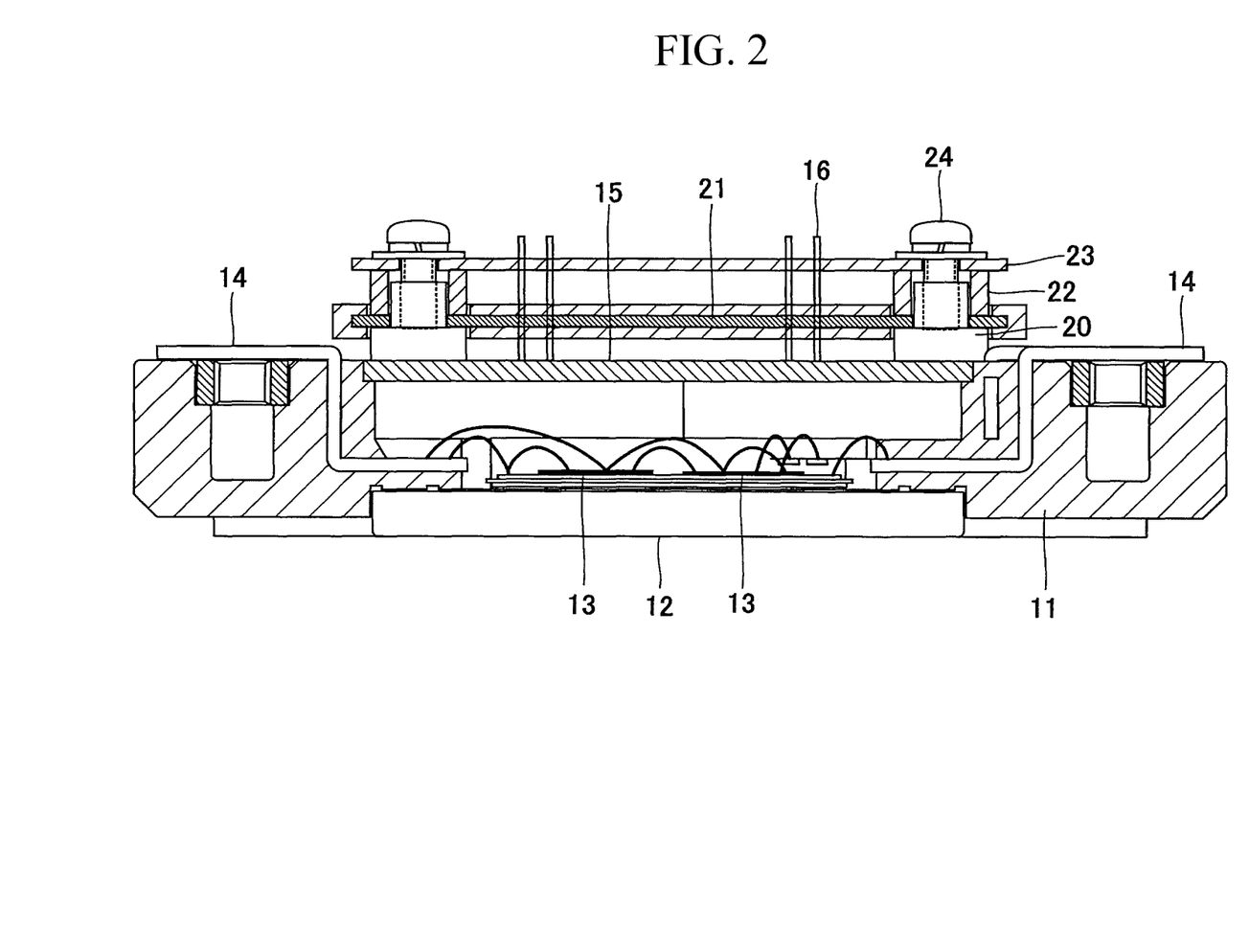
FIG. 2 shows a fragmentary sectional view of the semiconductor device according to the embodiment.

As illustrated in FIGS. 1 and 2, a semiconductor device according to an embodiment includes a semiconductor module 12 placed within a sheath case 11 of resin. The semiconductor module 12 includes a plurality of power semiconductor elements 13. For example, an IGBT and an FWD (Free Wheeling Diode) can be used as the plurality of power semiconductor elements 13. A main circuit of each power semiconductor element 13 is electrically connected by a bonding wire to a main circuit terminal 14 which is inserted in the sheath case 11. A screw terminal of the main circuit terminal 14 is exposed. An auxiliary circuit of each power semiconductor element 13 is electrically connected by a bonding wire to a pin terminal 16 which is extended to the outside via a lid 15 of the sheath case 11.

A step support 20 is implanted in the sheath case 11 by insert-molding. A shield plate 21 is mounted over the step support 20. A metal ring 22 is mounted over the shield plate 21. A control circuit board 23 is mounted over the metal ring 22. The control circuit board 23 is fixed by inserting an engagement member, such as a screw 24, into the step support 20.

Figure 3:
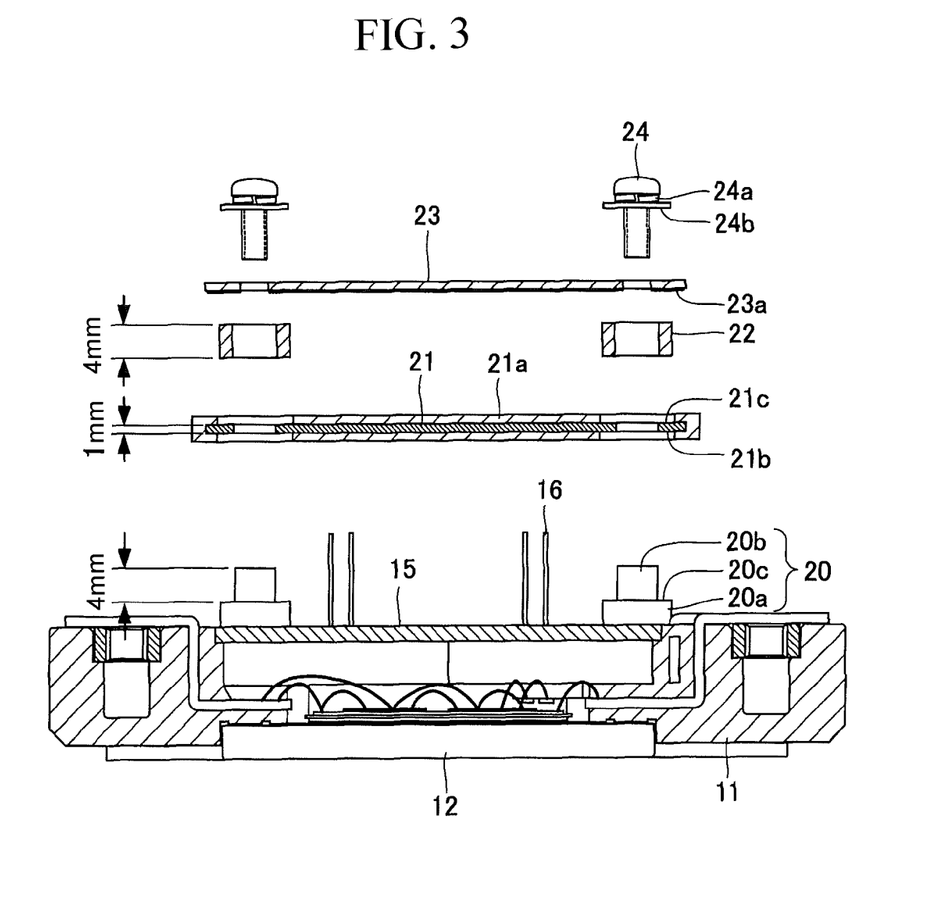
FIG. 3 shows an exploded view which illustrates the structure of the semiconductor device according to the embodiment illustrated in FIG. 2.

As illustrated in FIG. 3, the step support 20 includes a base portion 20a implanted in the sheath case 11, a connection portion 20b which extends from an end of the base portion 20a and which pierces the shield plate 21, and a step portion 20c formed at the boundary between the base portion 20a and the connection portion 20b. Preferably, each of the base portion 20a and the connection portion 20b of the step support 20 has the shape of a cylinder, the diameter of the connection portion 20b is smaller than that of the base portion 20a, and the base portion 20a and the connection portion 20b are coaxially arranged and are integrally formed. In addition, a female screw into which the screw 24 is screwed is formed in the connection portion 20b.

Figure 4:
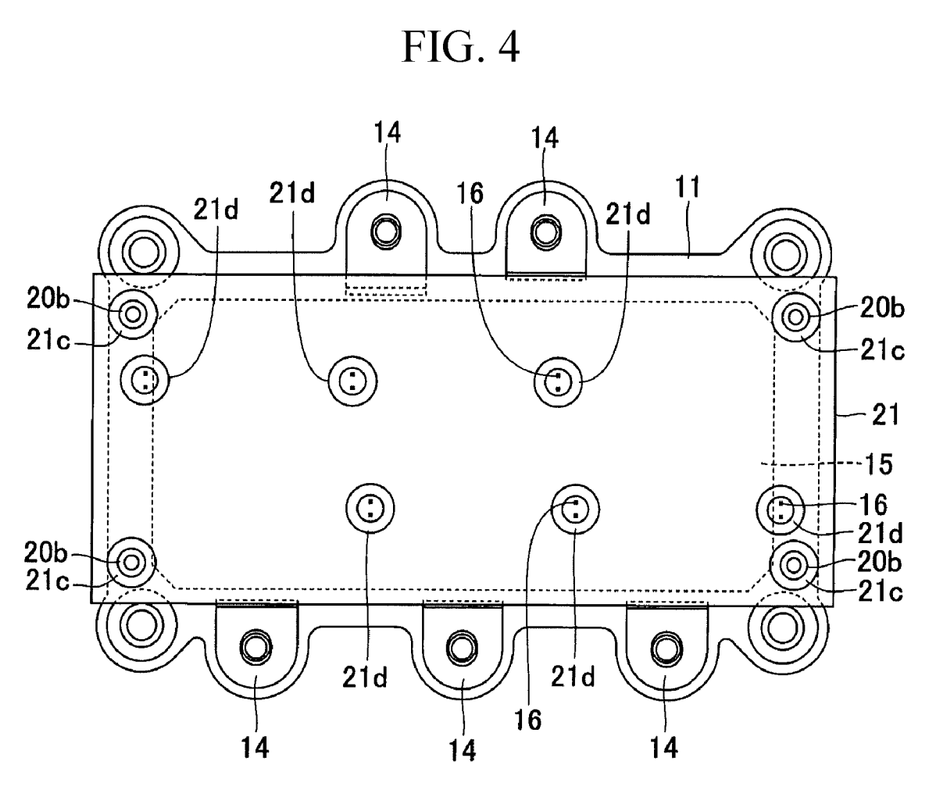
FIG. 4 shows a plan view which illustrates a state in which a shield plate is mounted.

The shield plate 21 is a plate made of aluminum, copper, iron, or the like and is insert-molded in an insulating resin 21a to provide electric insulation. PPS (polyphenylene sulfide) or PBT (polybutylene terephthalate) is used as the resin 21a. As illustrated in FIGS. 3 and 4, however, portions of the resin 21a corresponding to an area 21b, an area 21c and an area 21d are removed so that the areas 21b, 21c, and 21d will be exposed. The area 21b touches the step portion 20c of the step support 20, and the area 21c touches the metal ring 22. The area 21d is disposed around a penetration hole for the pin terminal 16. The resin 21a which covers the shield plate 21 is used when necessary. An insulating sheet can be stuck on the shield plate 21 in place of the resin 21a. In addition, an electromagnetic wave absorbing sheet can be stuck on at least one side of the shield plate 21 in place of the resin 21a.

The metal ring 22 has a penetration hole in the middle which pierces straight. The internal diameter of the penetration hole is slightly larger than the external diameter of the connection portion 20b of the step support 20. As a result, after the shield plate 21 is mounted over the step portion 20c of the step support 20, the metal ring 22 can be fitted easily onto the connection portion 20b protruding from the shield plate 21. Therefore, the metal ring 22 can be positioned easily at the time of assembly and assembly operations can be rationalized.

A copper pattern 23a connected to a ground line is formed in at least an area of the control circuit board 23 which touches the metal ring 22. The copper pattern 23a includes a conductive metal layer coated with, for example, nickel. As a result, the shield plate 21 is electrically connected to the ground line of the control circuit board 23 via the metal ring 22 and the copper pattern 23a.

A spring lock washer 24a and a plain washer 24b are integral parts of the screw 24 used, so they do not slip off. After the screw 24 is screwed into the connection portion 20b, the spring lock washer 24a and the plain washer 24b can prevent looseness of the screw 24 caused by, for example, vibration.

Figure 5:
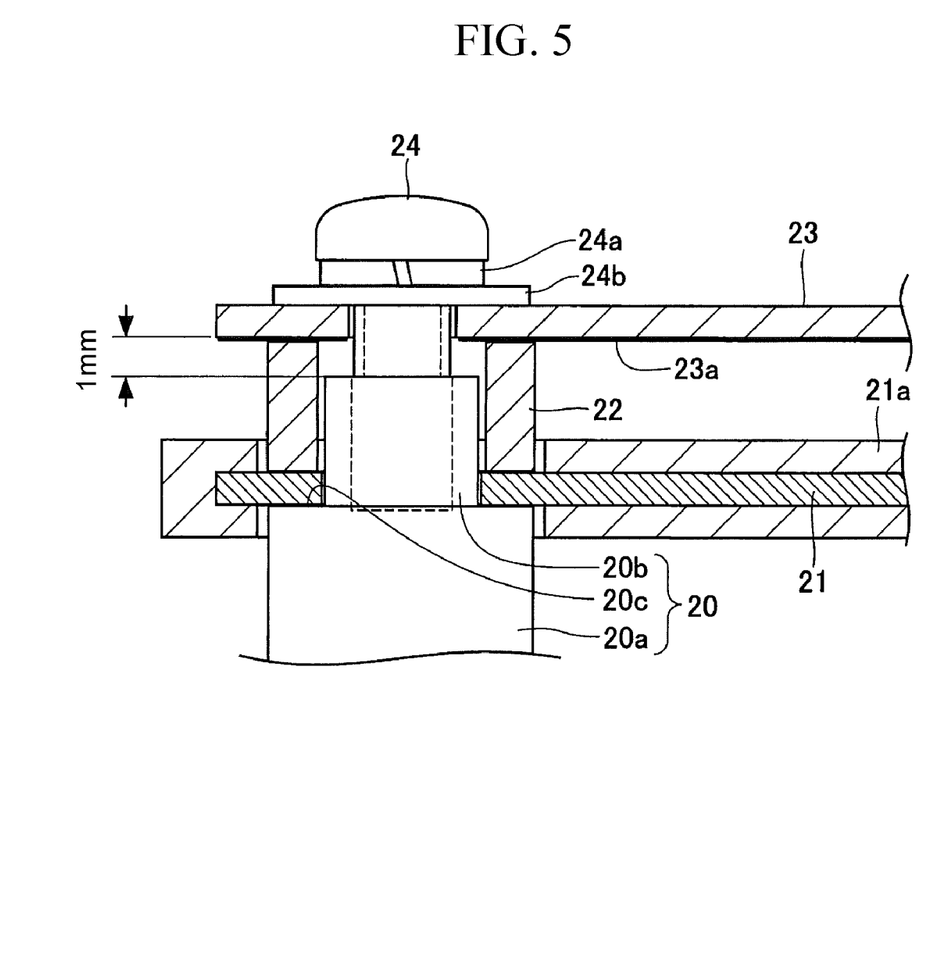
FIG. 5 shows an enlarged sectional view which illustrates the details of screwing.

The axial length (height) of the connection portion 20b of the step support 20 is set to, for example, 4 millimeters, the thickness of the shield plate 21 is set to, for example, 1 millimeter, and the axial length (height) of the metal ring 22 is set to, for example, 4 millimeters. As a result, when the shield plate 21 and the control circuit board 23 are fixed onto the connection portion 20b by the screw 24, an end of the metal ring 22 protrudes from an end of the connection portion 20b. More specifically, FIG. 5 shows that the upper end of the metal ring 22 is disposed at a level 1 millimeter higher than a level at which the upper end of the connection portion 20b is disposed. Since, in FIG. 5, the axial length of the connection portion 20b is the same as the axial length of the metal ring 22, the thickness of the shield plate 21 (for example, 1 millimeter) makes the difference in level between the connection portion 20b and the metal ring 22. Accordingly, a side over which the control circuit board 23 is mounted is formed of metal members including the step support 20, the shield plate 21, and the metal ring 22 which are not deformed by, for example, vibration. As a result, after the control circuit board 23 is fixed onto the connection portion 20b by the screw 24, looseness of the screw 24 caused by, for example, vibration can be minimized. If the deflection of the control circuit board 23 is taken into consideration, it is preferable that an amount by which the metal ring 22 protrudes from the connection portion 20b should be in the range of 0.2 to 1 millimeter.

Figure 6:
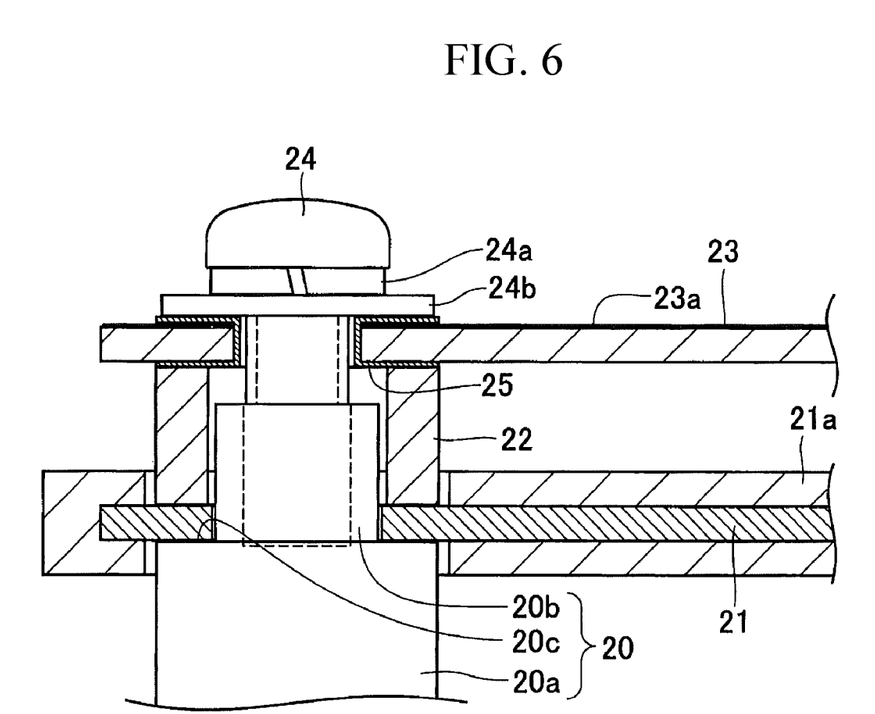
FIG. 6 shows an enlarged sectional view which illustrates the details of screwing according to a modification of a control circuit board.

FIG. 6 shows an enlarged sectional view which illustrates the details of screwing according to a modification of the control circuit board. The screw 24 pierces a control circuit board 23 and a via or a through hole 25 is formed in a mounting hole. As a result, it is possible to make a surface of the control circuit board 23 mounted over the metal ring 22. Accordingly, looseness of the screw 24 caused by, for example, vibration can be prevented. Moreover, if a copper pattern 23a electrically connected to a ground line is formed over a surface of the control circuit board 23 opposite the surface which touches the metal ring 22, the metal ring 22 can be connected to the copper pattern 23a via the through hole 25.

If the control circuit board 23 has a multilayer structure and the copper pattern 23a electrically connected to the ground line is formed as an intermediate layer, the metal ring 22 can be connected to the copper pattern 23a via a via formed.

In the above embodiment, the connection portion 20b of the step support 20 was described as a female screw. However, even if a step support in which a male screw protrudes from an end of the connection portion 20b and a nut are instead used for fixing the control circuit board 23, the same effect can be obtained.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

The invention claimed is:

1. A semiconductor device in which a control circuit board is mountable outside a sheath case, a power semiconductor element being placeable inside the sheath case, the device comprising:
   a metal step support including a base portion implanted in the sheath case, a connection portion which extends from an end of the base portion, and a step portion formed at a boundary between the base portion and the connection portion;
   a shield plate disposed over the step portion such that the connection portion of the step support pierces the shield plate; and
   a metal ring disposed around the connection portion and over the shield plate, an end of the metal ring being spaced apart from an end of the connection portion,
   wherein the semiconductor device is adapted such that the control circuit board is mounted over said end of the metal ring and is fixed onto the connection portion by an engagement member, and
   wherein said end of the metal ring is an upper end of the metal ring and said end of the connection portion is an upper end of the connection portion, and the upper end of the metal ring is disposed at a level higher than a level at which the upper end of the connection portion is disposed.

2. A semiconductor device in which a control circuit board is mountable outside a sheath case, a power semiconductor element being placeable inside the sheath case, the device comprising:
   a metal step support including a base portion implanted in the sheath case, a connection portion which extends from an end of the base portion, and a step portion formed at a boundary between the base portion and the connection portion;
   a shield plate disposed over the step portion such that the connection portion of the step support pierces the shield plate; and
   a metal ring disposed around the connection portion and over the shield plate, an end of the metal ring being spaced apart from an end of the connection portion,
   wherein:
   the semiconductor device is adapted such that the control circuit board is mounted over said end of the metal ring and is fixed onto the connection portion by an engagement member;
   the connection portion of the step support and the metal ring are equal in length; and
   said end of the metal ring is disposed at a level higher than a level at which the end of the connection portion is disposed by a thickness of the shield plate.

3. A semiconductor device in which a control circuit board is mountable outside a sheath case, a power semiconductor element being placeable inside the sheath case, the device comprising:
   a metal step support including a base portion implanted in the sheath case, a connection portion which extends from an end of the base portion, and a step portion formed at a boundary between the base portion and the connection portion;
   a shield plate disposed over the step portion such that the connection portion of the step support pierces the shield plate; and
   a metal ring disposed around the connection portion and over the shield plate, an end of the metal ring being spaced apart from an end of the connection portion,
   wherein:
   the semiconductor device is adapted such that the control circuit board is mounted over said end of the metal ring and is fixed onto the connection portion by an engagement member;
   each of the base portion and the connection portion of the step support has a shape of a cylinder;
   a diameter of the connection portion is smaller than a diameter of the base portion; and
   the base portion and the connection portion are coaxially arranged and are integrally formed.

4. The semiconductor device according to claim 1, wherein the connection portion of the step support has a female screw.

5. A semiconductor device in which a control circuit board is mountable outside a sheath case, a power semiconductor element being placeable inside the sheath case, the device comprising:
   a metal step support including a base portion implanted in the sheath case, a connection portion which extends from an end of the base portion, and a step portion formed at a boundary between the base portion and the connection portion;
   a shield plate disposed over the step portion such that the connection portion of the step support pierces the shield plate; and
   a metal ring disposed around the connection portion and over the shield plate, an end of the metal ring being spaced apart from an end of the connection portion,
   wherein the semiconductor device is adapted such that the control circuit board is mounted over said end of the metal ring and is fixed onto the connection portion by an engagement member, and
   wherein the shield plate is coated with an insulating resin except for areas which touch the step portion of the step support and the metal ring.

6. The semiconductor device according to claim 1, wherein a metal layer is formed in an area of the control circuit board which touches the metal ring.

7. A semiconductor device in which a control circuit board is mountable outside a sheath case, a power semiconductor element being placeable inside the sheath case, the device comprising:
   a metal step support including a base portion implanted in the sheath case, a connection portion which extends from an end of the base portion, and a step portion formed at a boundary between the base portion and the connection portion;
   a shield plate disposed over the step portion such that the connection portion of the step support pierces the shield plate; and a metal ring disposed around the connection portion and over the shield plate, an end of the metal ring being spaced apart from an end of the connection portion, wherein the semiconductor device is adapted such that the control circuit board is mounted over said end of the metal ring and is fixed onto the connection portion by an engagement member, and wherein the shield plate is electrically connected to a ground line of the control circuit board via the metal ring and a through hole or a via formed in a mounting hole made in the control circuit board screwed to the connection portion.

8. The semiconductor device according to claim 1, wherein the metal ring has a shape of a pipe.

9. The semiconductor device according to claim 1, wherein the engagement member is a screw.

10. The semiconductor device according to claim 1, further comprising a pin terminal extended to an outside from a lid of the sheath case.

11. The semiconductor device according to claim 10, wherein the shield plate is coated with an insulating resin except for an area which is disposed around a penetration hole for the pin terminal.

12. The semiconductor device according to claim 10, wherein the semiconductor device is adapted such that an auxiliary circuit of the power semiconductor element is electronically connected by a bonding wire to the pin terminal.

13. The semiconductor device according to claim 1, wherein an insulating sheet is stuck on the shield plate.

14. The semiconductor device according to claim 1, wherein electromagnetic wave absorbing sheet is stuck on at least one side of the shield plate.

15. The semiconductor device according to claim 1, wherein an amount by which the upper end of the metal ring is disposed at a level higher than the upper end of the connection portion is in the range of 0.2 to 1 millimeter.

16. The semiconductor device according to claim 1, wherein the engagement member is a male screw and a nut.

* * * * *